United States Patent
DeLaCruz

(10) Patent No.: US 9,984,997 B2
(45) Date of Patent: May 29, 2018

(54) COMMUNICATION INTERFACE ARCHITECTURE USING SERIALIZER/DESERIALIZER

(71) Applicant: eSilicon Corporation, San Jose, CA (US)

(72) Inventor: Javier DeLaCruz, Summit, NJ (US)

(73) Assignee: eSilicon Corporation, San Jose, CA (US)

( * ) Notice: Subject to any disclaimer, the term of this patent is extended or adjusted under 35 U.S.C. 154(b) by 0 days. days.

(21) Appl. No.: 14/810,261

(22) Filed: Jul. 27, 2015

(65) Prior Publication Data

US 2016/0027482 A1 Jan. 28, 2016

Related U.S. Application Data

(60) Provisional application No. 62/029,759, filed on Jul. 28, 2014.

(51) Int. Cl.
| | | |
|---|---|---|
| *G11C 7/00* | (2006.01) | |
| *H01L 25/065* | (2006.01) | |
| *H01L 25/18* | (2006.01) | |
| *G11C 7/10* | (2006.01) | |
| *H01L 23/538* | (2006.01) | |
| *G11C 5/04* | (2006.01) | |

(52) U.S. Cl.
CPC ........... *H01L 25/0655* (2013.01); *G11C 7/10* (2013.01); *H01L 23/5381* (2013.01); *H01L 23/5384* (2013.01); *H01L 25/18* (2013.01); *G11C 5/04* (2013.01); *G11C 2207/107* (2013.01); *H01L 2224/16225* (2013.01); *H01L 2924/15192* (2013.01)

(58) Field of Classification Search
CPC ............ H01L 25/0655; H01L 23/5384; H01L 23/5381; H01L 25/18; H01L 2924/15192; H01L 2224/16225; G11C 7/10; G11C 5/04; G11C 2207/107
See application file for complete search history.

(56) References Cited

U.S. PATENT DOCUMENTS

| | | | |
|---|---|---|---|
| 7,770,047 B2 | 8/2010 | Kelly | |
| 7,911,834 B2 | 3/2011 | Cromwell et al. | |
| 2012/0025397 A1 | 2/2012 | Miller et al. | |
| 2012/0223429 A1 | 9/2012 | Khan et al. | |
| 2013/0056881 A1 | 3/2013 | Zhang | |
| 2013/0214432 A1 | 8/2013 | Wu | |
| 2013/0336039 A1* | 12/2013 | Frans ........................ | G11C 5/02 365/51 |
| 2014/0176234 A1* | 6/2014 | King ................... | H04L 25/0286 327/565 |
| 2014/0321804 A1* | 10/2014 | Thacker ............... | G02B 6/4274 385/14 |

FOREIGN PATENT DOCUMENTS

WO    WO 2013/030622 A1    3/2013

OTHER PUBLICATIONS

PCT International Search Report and Written Opinion for PCT/US15/42297, dated Nov. 2, 2015, 11 Pages.

* cited by examiner

*Primary Examiner* — Mohammed A Bashar
(74) *Attorney, Agent, or Firm* — Fenwick & West LLP

(57) ABSTRACT

A memory interface architecture uses a serializer/deserializer (SerDes) to connect a memory array on one semiconductor die to a device on another semiconductor die, for example via a fast interposer.

17 Claims, 4 Drawing Sheets

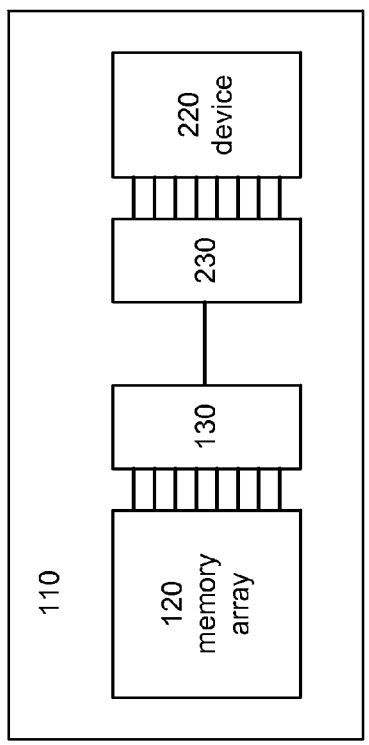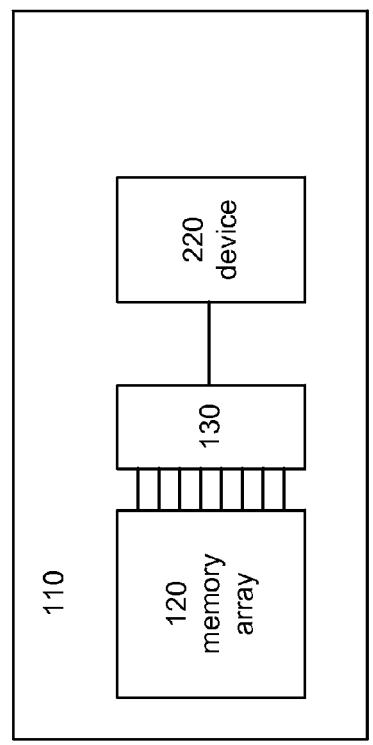

COMMUNICATION INTERFACE ARCHITECTURE USING SERIALIZER/DESERIALIZER

CROSS-REFERENCE TO RELATED APPLICATION(S)

This application claims priority under 35 U.S.C. § 119(e) to U.S. Provisional Patent Application Ser. No. 62/029,759, "Communication interface architecture using serializer/deserializer," filed Jul. 28, 2014. The subject matter of the foregoing is incorporated herein by reference in its entirety.

BACKGROUND OF THE INVENTION

1. Field of the Invention

This invention relates to die-to-die communication, for example as may be used in memory applications.

2. Description of the Related Art

Communications is an important part of semiconductor devices. Consider memory as an example. Many memory interface types exist. However, memory interfaces typically use a highly parallel interface (e.g., memory bus) that is inefficient in interface width and power. That is, the memory interface typically requires a large number of pins because it is highly parallel and it typically requires a relatively large amount of power per bit of data. As applications become more memory bandwidth intensive, the total number of pins required and the total amount of power required can become prohibitively large.

Thus, there is a need for better communication architectures, including memory interface architectures.

BRIEF DESCRIPTION OF THE DRAWINGS

The invention has other advantages and features which will be more readily apparent from the following detailed description of the invention and the appended claims, when taken in conjunction with the accompanying drawings, in which:

FIGS. 5A-5B are top views of memory architectures, according to yet additional embodiments of the invention.

DETAILED DESCRIPTION OF THE PREFERRED EMBODIMENTS

Figure 1A:
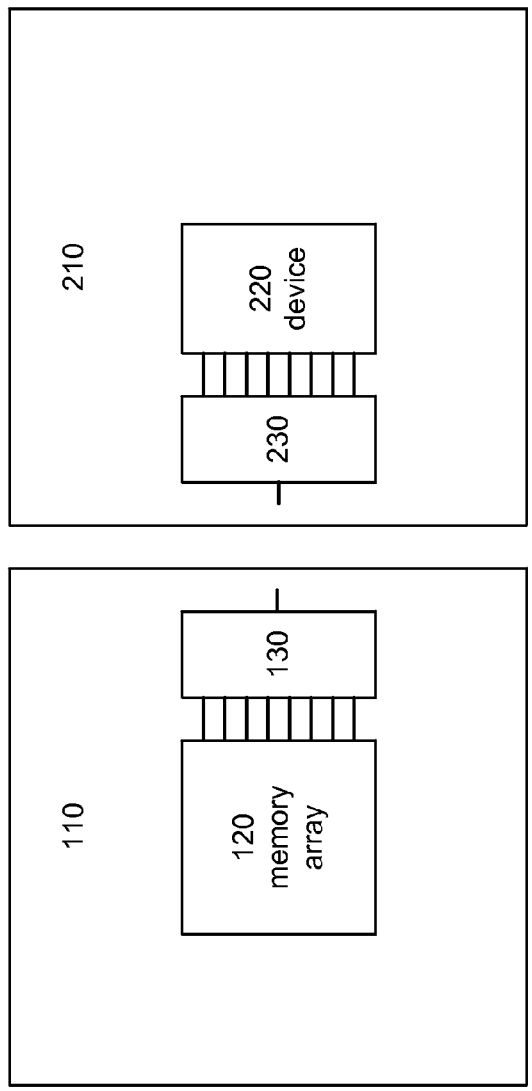
FIGS. 1A-1B are a top view and side view of a memory architecture, according to one embodiment of the invention.
Figure 1B:
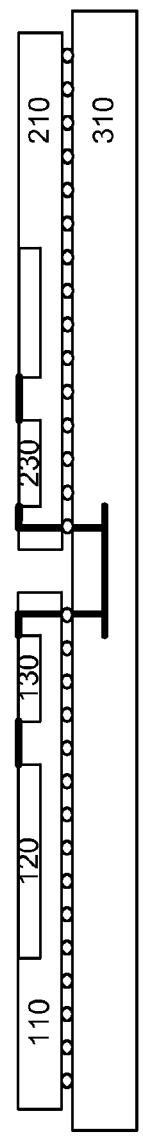

In one aspect, a memory interface architecture uses a serializer/deserializer (SerDes). FIGS. 1A-1B are a top view and side view of a memory architecture, according to one embodiment of the invention. The memory array 120 on a semiconductor die 110 typically has a row and column structure with a parallel readout in which a row is selected and multiple bits in that row are read out in parallel. A SerDes 130 converts the parallel data readout into a serial data stream, albeit at a higher line rate compared to that of each individual parallel line. The memory die 110 is connected to another die 210 (e.g., containing a memory controller, processor or other device) via an interposer 310. For clarity, the interposer 310 is not shown in FIG. 1A. High speed die-to-die data transmission can be achieved if, for example, the two die 110, 210 are connected through a non-silicon interposer 310. Common non-silicon interposer materials include organic and glass. The second die 210 may also have a SerDes 230 to convert the serial data stream back to a parallel form for use by the device 220. Alternately, the device 220 may use the serial stream directly. Examples of device 220 include gearbox, processor, controller, FPGA, analog device, power device, ADC, DAC or MEMS device, for example.

The use of direct die-to-die transmission (e.g., without having to go outside the package) with fast interposers or other types of fast connections can have many potential advantages. The SerDes can be optimized for die-to-die interconnect. Such a SerDes typically would not be sufficient for transmission off package. For example, this die-to-die approach may reduce or eliminate electrostatic discharge requirements. It can also reduce or eliminate the need for bytelane deskew (i.e., there is no need to consider skew from package to package routes on a printed circuit board). It may also reduce or eliminate pre-emphasis and equalization since the load on the SerDes can be well defined. It can also reduce the power required per bit. Because of the well-defined load, the SerDes may in some cases achieve power efficiencies of less than 1 pJ/bit, even as low as 0.3 pJ/bit or less. The higher speed SerDes can result in higher bandwidths per interface edge, for example possibly 1 terabit per second per die edge or more. A bump pitch of 80 µm or better is possible with current substrate technology. Future package capabilities may reduce this pitch. An alternate preferred approach is to eliminate the use of interposers entirely for the direct die-to-die transmission path.

Figure 2:
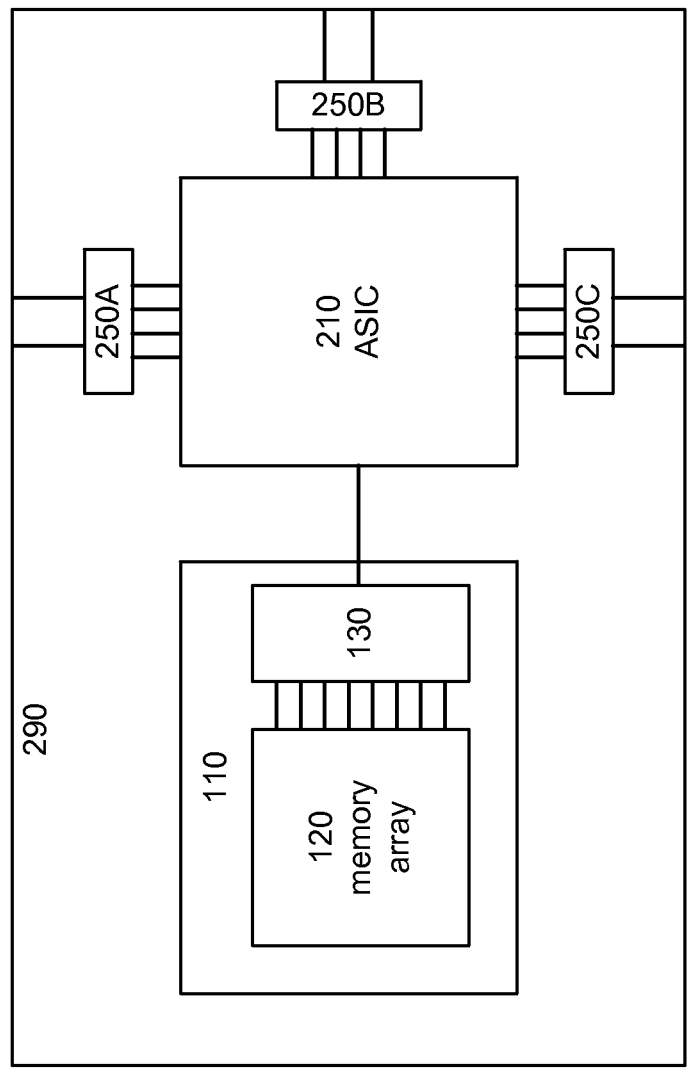
FIG. 2 is a side view of a memory architecture, according to another embodiment of the invention.

The example given above was for a memory interface architecture, but this approach is not limited memory interface architectures. It can also be used in other instances, where direct die-to-die communication using SerDes might have advantage over more conventional communication schemes. The approach also is not limited to two die in a package, as shown in FIG. 1. It can be used with more than two die in a package, and preferably from 2-12 die in a package. FIG. 2 shows a top view of an example. In this example, die 110 contains a memory array 120 with SerDes 130 interface to the die. The direct die-to-die transmission path is from die 110 to die 210, which in this example is an ASIC. The ASIC 210 is connected to "gearboxes" 250A,B,C, each of which changes the interface according to a different standard. Each of the gearboxes 250A,B,C has an interface to go outside the package. In FIG. 2, the package boundary is represented by the rectangle 290.

Figure 3:
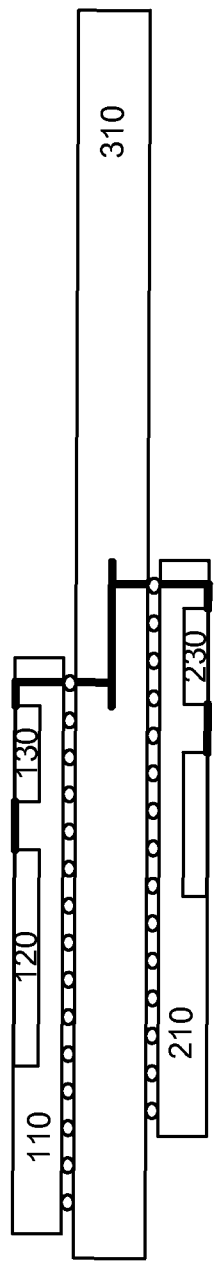
FIG. 3 is a side view of a memory architecture, according to yet another embodiment of the invention.
Figure 4:
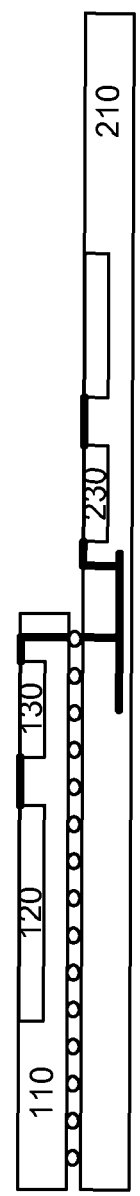
FIG. 4 is a side view of a memory architecture, according to yet another embodiment of the invention.

The approach also is not limited to the specific architecture shown in FIGS. 1 and 2. FIG. 3 shows a side view of a memory architecture where the two die 110 and 210 are mounted to opposite sides of a non-silicon interposer 310, rather than side by side on the same side of the interposer. In FIG. 4, one die 110 is mounted directly on the other die 210.

In yet another approach, the transmission path may be within a single die, rather than die-to-die. For example, as shown in FIGS. 5A-5B, the memory array 120 and SerDes 130 are part of a die 110, and the corresponding device 220 is part of the same die 110 so that the serial data stream is transmitted only within the die 110. In FIG. 5A, the device 220 has a parallel interface so an additional SerDes 230 converts between serial and parallel for the device 220. In FIG. 5B, the device 220 interfaces directly to the serial data stream.

In another variation, the memory array is a stacked memory array (i.e., composed of multiple die stacked on top of each other). The SerDes may be implemented as part of the die on the bottom of the stack, which may also include memory controller circuitry.

What is claimed is:

1. A semiconductor product comprising:
   a first semiconductor die including a memory array and a serializer/deserializer (SerDes), the SerDes connected to the memory array, the SerDes converting parallel data read out from the memory array into a serial data stream;
   a second semiconductor die including a device with access to the memory array;
   a direct die-to-die transmission path between the first die and the second die, for transmitting the serial data stream between the first die and the second die, wherein the direct die-to-die transmission path terminates at the device and at the memory array; and
   wherein the direct die-to-die transmission path is a non-silicon interposer, and wherein the first semiconductor die and the second semiconductor die are mounted to opposite sides of the non-silicon interposer.

2. The semiconductor product of claim 1 further comprising:
   a chip package that contains the first and second die and the direct die-to-die transmission path between the first and second die.

3. The semiconductor product of claim 1 wherein the second die further includes a SerDes connected to the device, the direct die-to-die transmission path connecting the SerDes on the first die to the SerDes on the second die.

4. The semiconductor product of claim 1 wherein the non-silicon interposer is a glass interposer.

5. The semiconductor product of claim 1 wherein the non-silicon interposer is an organic interposer.

6. The semiconductor product of claim 1 wherein the first semiconductor die and second semiconductor die are mounted to a same side of the non-silicon interposer.

7. The semiconductor product of claim 1 wherein the SerDes has a power efficiency of less than 1 pJ/bit.

8. The semiconductor product of claim 7 wherein the SerDes has a power efficiency of less than 0.3 pJ/bit.

9. The semiconductor product of claim 1 wherein the SerDes has a power that is sufficient to drive the direct die-to-die transmission path but is not sufficient to drive a package-to-package transmission path.

10. The semiconductor product of claim 1 wherein the first die has a bandwidth per die edge of at least 1 terabit per second per die edge.

11. The semiconductor product of claim 1 wherein a data path from the memory array to the device via the SerDes does not include any circuitry for bytelane deskew.

12. The semiconductor product of claim 1 wherein a data path from the memory array to the device via the SerDes does not include any circuitry for equalization or pre-emphasis.

13. The semiconductor product of claim 1 wherein the device on the second semiconductor die is a processor.

14. The semiconductor product of claim 1 wherein the device on the second semiconductor die is an ASIC connected to a gearbox.

15. The semiconductor product of claim 1 wherein the device on the second semiconductor die contains analog circuitry.

16. A semiconductor die comprising:
   a memory array and a serializer/deserializer (SerDes), the SerDes connected to the memory array, the SerDes converting parallel data read out from the memory array into a serial data stream;
   a device with access to the memory array;
   a direct transmission path between the SerDes and the device, for transmitting the serial data stream between the SerDes and the device, wherein the direct transmission path terminates at the device and at the memory array; and
   wherein the direct die-to-die transmission path is a non-silicon interposer, and wherein the SerDes and the device are mounted to opposite sides of the non-silicon interposer.

17. The semiconductor die of claim 16, wherein the device comprises a second SerDes, and the direct transmission path transmits the serial data stream between the SerDes connected to the memory array and the second SerDes of the device.

* * * * *